(12) United States Patent
Park (10) Patent No.: US 9,666,249 B1
(45) Date of Patent: May 30, 2017

(54) DATA STORAGE DEVICE WITH TEMPERATURE COMPENSATION AND OPERATING METHOD THEREOF

(71) Applicant: SK hynix Inc., Gyeonggi-do (KR)

(72) Inventor: Sang Hyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/188,732

(22) Filed: Jun. 21, 2016

(30) Foreign Application Priority Data

Feb. 24, 2016 (KR) ........................ 10-2016-0021928

(51) Int. Cl.
| G11C 7/00 | (2006.01) |
| G11C 7/10 | (2006.01) |
| G11C 7/04 | (2006.01) |

(52) U.S. Cl.
CPC . *G11C 7/10* (2013.01); *G11C 7/04* (2013.01)

(58) Field of Classification Search
CPC ....................................................... G11C 7/04
USPC ............................................................ 365/211
See application file for complete search history.

(56) References Cited

U.S. PATENT DOCUMENTS

| 2014/0281311 | A1* | 9/2014 | Walker | G06F 3/0631 |
| | | | | 711/162 |
| 2016/0284393 | A1* | 9/2016 | Ramalingam | G11C 11/56 |

FOREIGN PATENT DOCUMENTS

KR    1020120056424    6/2012

* cited by examiner

*Primary Examiner* — Hoai V Ho
(74) *Attorney, Agent, or Firm* — IP & T Group LLP (57) ABSTRACT

A data storage device includes a nonvolatile memory device including a memory cell region which is divided into a first region and a second region; and a controller configured to control a program operation of the nonvolatile memory device according to a write request of an external device, wherein the controller provides a temperature compensation off command to the nonvolatile memory device before providing data, a program command for commanding program of the data and an address of the first region to the nonvolatile memory device, and wherein, while programming the data in a memory cell corresponding to the address of the first region according to the program command for commanding program of the data, the nonvolatile memory device omits a temperature compensation operation of changing a program verify operation to be applied to the memory cell, according to a temperature variation.

19 Claims, 10 Drawing Sheets

DATA STORAGE DEVICE WITH TEMPERATURE COMPENSATION AND OPERATING METHOD THEREOF

CROSS-REFERENCES TO RELATED APPLICATION

The present application claims priority under 35 U.S.C. §119(a) to Korean application number 10-2016-0021928, filed on Feb. 24, 2016, in the Korean Intellectual Property Office, which is incorporated herein by reference in its entirety.

BACKGROUND

1. Technical Field

Various embodiments generally relate to a data storage device including a nonvolatile memory device as a storage medium.

2. Related Art

Recently, the paradigm for the computer environment has been converted into ubiquitous computing so that computer systems can be used anytime and anywhere. Due to this, use of portable electronic devices such as, for example, mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a data storage device including a memory device, the data storage device exhibiting improved writing speed.

In an embodiment, a data storage device may include: a nonvolatile memory device including a memory cell region which is divided into a first region and a second region; and a controller configured to control a program operation of the nonvolatile memory device according to a write request of an external device, wherein the controller provides a temperature compensation off command to the nonvolatile memory device before providing data, a program command for commanding program of the data and an address of the first region to the nonvolatile memory device, and wherein, while programming the data in a memory cell corresponding to the address of the first region according to the program command for commanding program of the data, the nonvolatile memory device omits a temperature compensation operation of changing a program verify operation to be applied to the memory cell, according to a temperature variation.

In an embodiment, a method for operating a data storage device including a nonvolatile memory device which includes a memory cell region divided into a first region and a second region and a temperature sensor, and a controller for controlling the nonvolatile memory device, may include: performing a buffer program operation of storing data write-requested from an external device, in the first region, and transmitting a response to a write request, to the external device; and performing a main program operation of moving and storing the data stored in the first region, to and in the second region, during an idle time, wherein a temperature compensation operation of changing a program verify voltage to be applied to a memory cell, according to a temperature variation, is omitted while performing the buffer program operation, and is performed while performing the main program operation.

According to the embodiments, the writing speed of a data storage device may be improved.

DETAILED DESCRIPTION

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in sufficient detail to the enable a person skilled in the art to which the invention pertains to practice the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or Intervening elements may be present. As used herein, a singular form is intended to include plural forms as well, unless the context clearly indicates otherwise. It will be further understood that the terms "includes," "including," "comprises," and/or "comprising" when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

Figure 1:
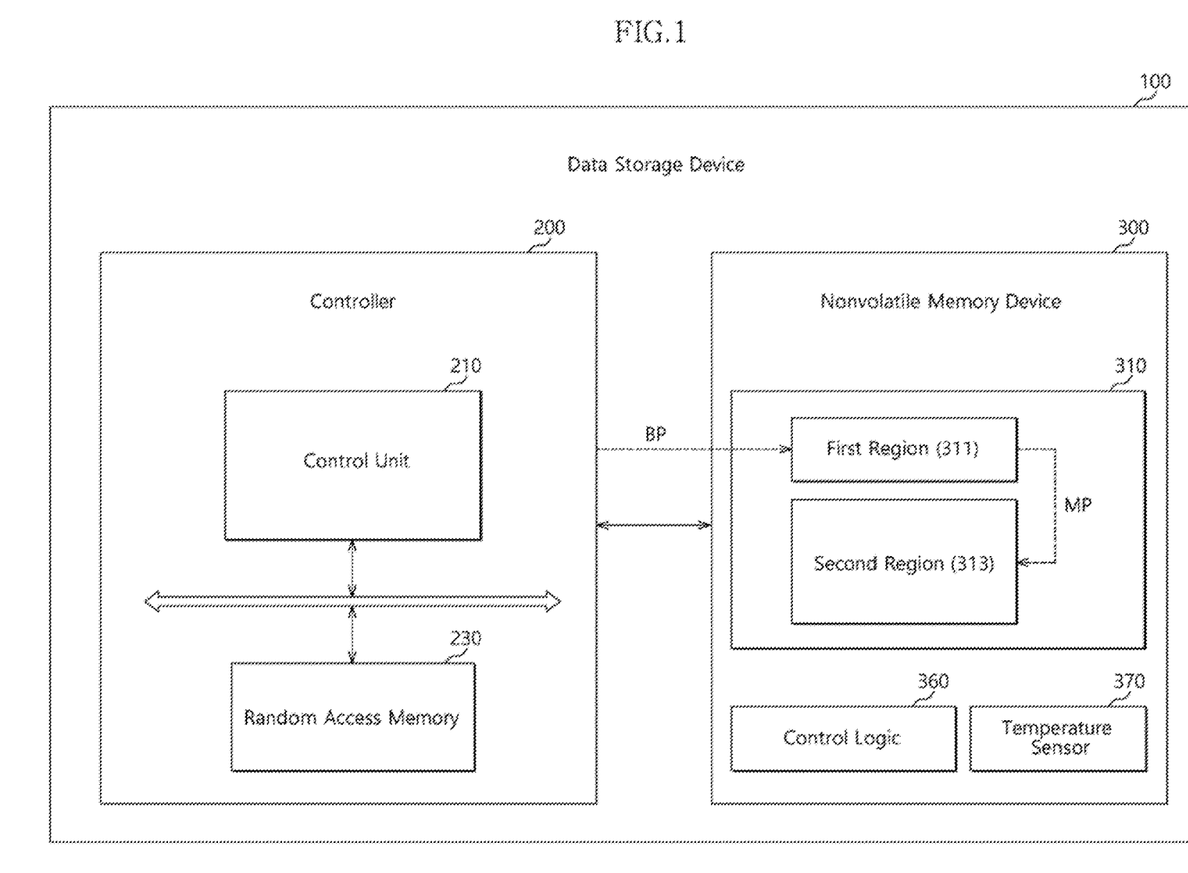
FIG. 1 is a block diagram illustrating a data storage device according to an embodiment of the present invention

Referring now to FIG. 1 a data storage device 100 is provided, according to an embodiment of the present invention.

The data storage device 100 may store data to be accessed by a host device (not shown), such as, for example, a mobile phone, an MP3 player, a laptop computer, a desktop computer, a game player, a TV, an in-vehicle infotainment system, and the like. The data storage device 100 may also be referred to as a memory system.

The data storage device 100 may be manufactured as any one of various data storage devices according to the protocol of an interface which is coupled electrically with the host device. For example, the data storage device 100 may be configured as any one of various data storage devices, such as, for example, a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The data storage device 100 may be manufactured as any one of various packages, such as, for example, a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200 and a nonvolatile memory device 300. The controller 200 may include a control unit 210 and a random access memory 230. The control unit 210 may control the general operations of the controller 200. For example, the control unit 210 may analyze and process a signal, a command or a request received from the host device. The control unit 210 may decode and drive a firmware or a software loaded on the random access memory 230. The control unit 210 may be realized in the form of a hardware or in a combined form of a hardware and a software. The random access memory 230 may store a firmware or a software to be driven by the control unit 210. Also, the random access memory 230 may store data necessary for driving of the firmware or the software, for example, management data such as, for example, an address mapping information. The random access memory 230 may operate as a working memory of the control unit 210. The random access memory 230 may operate as a data buffer memory or a data cache memory. For example, the random access memory 230 may temporarily store data to be transmitted from the host device to a nonvolatile memory device 300 or from the nonvolatile memory device 300 to the host device.

The nonvolatile memory device 300 may operate as a storage medium of the data storage device 100. The nonvolatile memory device 300 may be or include any one of nonvolatile memory devices, such as, for example, a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide. The ferroelectric random access memory (FRAM), the magnetic random access memory (MRAM), the phase change random access memory (PCRAM) and the resistive random access memory (RERAM) are nonvolatile random access memory devices capable of random access to memory cells. The nonvolatile memory device 300 may be or include a combination of a NAND flash memory device and any one of the above-described nonvolatile random access memory devices.

The nonvolatile memory device 300 may include a memory cell region 310, a control logic 360 and a temperature sensor 370.

The memory cell region 310 may be divided into a first region 311 and a second region 313. Each of the first region 311 and the second region 313 may include a plurality of memory cells. Each of the memory cells may be or include a single level cell (SLC) capable of storing 1-bit data. The SLC may be erased to have a threshold voltage of an erase state or may be programmed to have a threshold voltage corresponding to a program state. Each of the memory cells may be or include a multi-level cell (MLC) capable of storing 2 or more-bit data. The MLC may be erased to have a threshold voltage of an erase state or may be programmed to have a threshold voltage corresponding to any one of a plurality of program states.

For instance, each of the memory cells included in the first region 311 may store 1-bit data, and each of the memory cells included in the second region 313 may store 2- or more-bit data. For another instance, each of the memory cells included in the first region 311 may store 2-bit data, and each of the memory cells included in the second region 313 may store 3 or more-bit data. That is to say, storage capacity of the memory cells included in the first region 311 may be smaller than that of the memory cells included in the second region 313.

That is, the first region 311 and the second region 313 may be or include different types of memory devices forming a hybrid memory device. The hybrid memory device (310) may include both SLCs and MLCs and selectively operate in one of SLC and MLC schemes. For example, the first region 311 may be or include a SLC memory device, and the second region 313 may be or include a MLC memory device. In this example, the first region 311 may operate in the SLC scheme, and the second region 313 may operate in the MLC scheme.

Because the storage capacity of the memory cells included in the first region 311 is smaller than that of the memory cells included in the second region 313, the program speed of the memory cells included in the first region 311 may be faster than the program speed of the memory cells included in the second region 313. An embodiment of the present invention uses this cell characteristic of the first region 311 and the second region 313.

According to an embodiment of the present invention, the controller 200 performs a buffer program operation (denoted with "BP" In FIG. 1) to the first region 311 by storing write data provided with a program command from the host device in the first region 311 while the controller 200 may perform a main program operation (denoted with "MP" in FIG. 1) to the second region 313 by moving data from the first region 311 to the second region 313. The buffer program operation may be faster than the main program operation due to difference in the program speed of the memory cells between the first region 311 and the second region 313.

Upon completion of the buffer program operation to the first region 311 in response to the program command, the controller 200 may report completion of the program operation to the host device as a response to the write request. After transmitting the response to the write request of the host device, the controller 200 may perform the main program operation to the second region 313 by reading the write data from the first region 311 and programming the write data in the second region 313. For example, the controller 200 may perform the main program operation by moving the write data from the first region 311 to the second region 313 during an idle time in which there is no request from the host device. Storing the write data in the nonvolatile memory device 300 through the buffer program operation and the main program operation, the write request received from the host device may be processed faster since the host device receives the report of the completion of the program operation upon completion of the buffer program operation to the first region 311, for which the program speed is faster than for the second region 313.

Further, a smaller storage capacity per memory cell (e.g., the SLC) of the first region 311 guarantees higher reliability of the memory cells in the first region 311. The reliability of a memory cell having a smaller storage capacity may be ensured even though the memory cell may not be programmed precisely in the first region 311. Moreover, further increase of the speed of the buffer program operation to the first region 311 may be obtained, by the controller 200 performing a temperature compensation operation due to a temperature variation of the nonvolatile memory device 300 only in the second region and not in the first region 311. This is possible because of the inherent higher reliability of the first region 311 compared to the second region 313.

Figure 2:
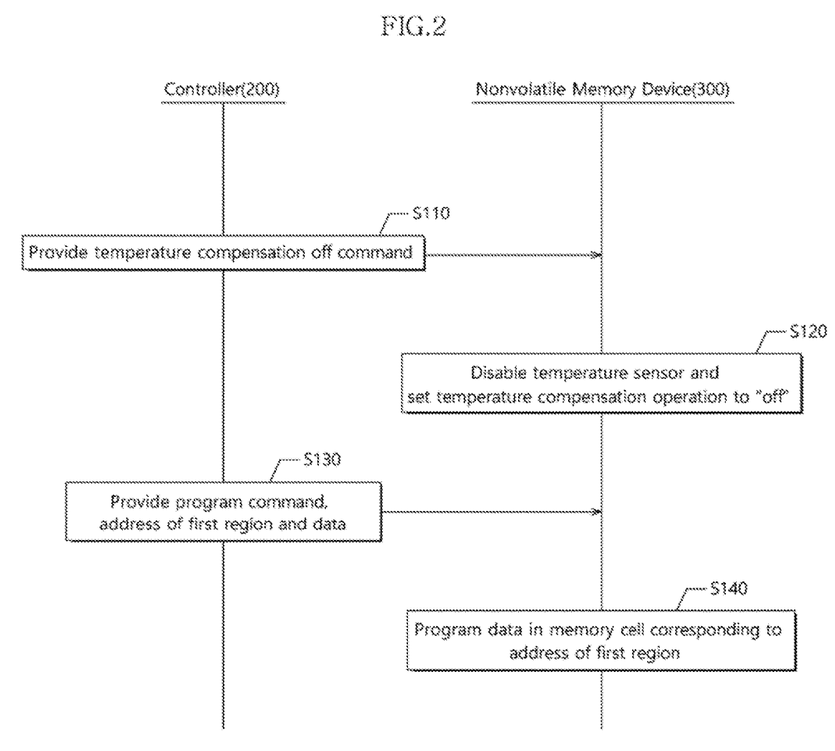
FIG. 2 is a flow chart illustrating a buffer program operation of the nonvolatile memory device shown in FIG. 1, according to an embodiment of the present invention.

FIG. 2 is a flow chart illustrating a buffer program operation of the nonvolatile memory device 300, according to an embodiment of the invention.

Referring to FIGS. 1 and 2, at step S110, a buffer program operation of the nonvolatile memory device 300, includes providing a temperature compensation off command. For example, the controller 200 may provide the temperature compensation off command to the nonvolatile memory device 300. The temperature compensation off command may be a special command for controlling the temperature compensation operation so that it may not be performed internally of the nonvolatile memory device 300.

At step S120, the buffer program operation may further include disabling a temperature sensor and setting a temperature compensation operation to off. For example, the control logic 360 of the nonvolatile memory device 300 may disable the temperature sensor 370 in response to the temperature compensation off command. If the temperature sensor 370 is disabled, during a following buffer program operation, an operation for measuring a temperature may not be performed, hence, a resource for measuring a temperature may not be consumed. Moreover, the control logic 360 of the nonvolatile memory device 300 may set the temperature compensation operation to "off" in response to the temperature compensation off command. If the temperature compensation operation is set to "off," the temperature compensation operation may not be performed during the following buffer program operation.

At step S130, the buffer program operation further includes providing a program command, an address of the first region and data (write data). For example, the controller 200 may provide a program command, an address of the first region 311 and write data to the nonvolatile memory device 300.

At step S140, the buffer program operation further includes programming the write data in a memory cell corresponding the address of the first region. For example, the control logic 360 of the nonvolatile memory device 300 may perform the buffer program operation to the first region 311 by storing the write data in the first region 311 in response to the program command and the address of the first region 311. During the buffer program operation, the temperature measuring operation and the temperature compensation operation may be omitted. Therefore, the program operation may be performed faster due to the omission of the temperature measuring operation and the temperature compensation operation during the buffer program operation.

Figure 3:
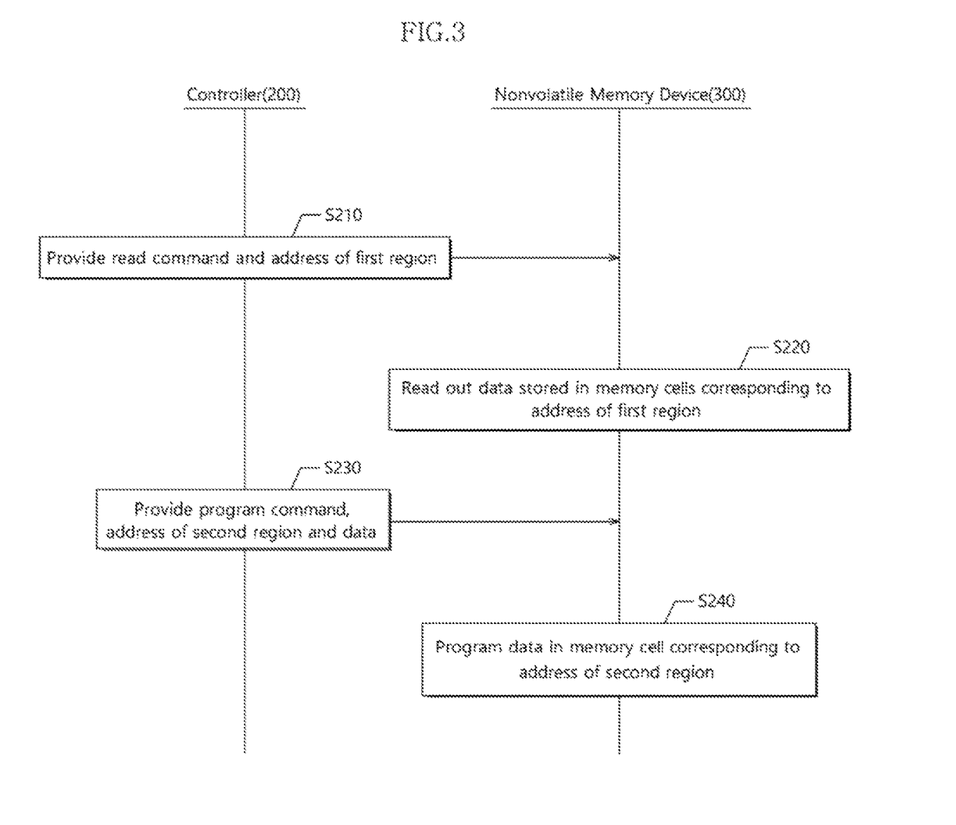
FIG. 3 is a flow chart illustrating a main program operation of the nonvolatile memory device shown in FIG. 1, according to an embodiment of the present invention.

FIG. 3 is a flow chart illustrating a main program operation of the nonvolatile memory device 300, according to an embodiment of the invention.

Referring to FIGS. 1 and 3, at step S210, a main program operation may include providing a read command and an address of the first region. For example, the controller 200 may provide a read command and an address of the first region 311 to the nonvolatile memory device 300. Such control by the controller 200 may be performed to read out the write data stored in the first region 311.

At step S220, the main program operation may further include reading out data stored in a memory cell in response to the read command and the address of the first region. For example, the control logic 360 of the nonvolatile memory device 300 may read out the write data stored in the first region 311, and may provide the read-out data to the controller 200.

At step S230, the main operation may further include providing a program command, an address of the second region and write data. For example, the controller 200 may provide a program command, an address of the second region 313 and the write data, which is read out from the first region 311 at step S220, to the nonvolatile memory device 300.

At step S240, the main program operation may further include programming the write data in the memory cell corresponding to the address of the second region. For example, in response to the program command and the address of the second region 313, the control logic 360 of the nonvolatile memory device 300 may program the provided write data in the second region 313. While the main program operation is being performed, the control logic 360 may compare a temperature measured through the temperature sensor 370 and a reference temperature, and may normally perform a temperature compensation operation of compensating for a temperature variation, based on a comparison result.

As described above with reference to FIGS. 2 and 3, the temperature measurement and temperature compensation operations are not performed while the buffer program operation is performed. The temperature measurement and compensation operations may be normally performed only while the main program operation is performed. The buffer operation may be performed faster than the main program operation of the lower level bit capability of the memory cells employed in the first region as compared to the memory cells in the second region. Moreover, by performing the temperature measurement and temperature compensation only when the main program operation is performed the buffer program operation may be performed even faster.

Figure 4:
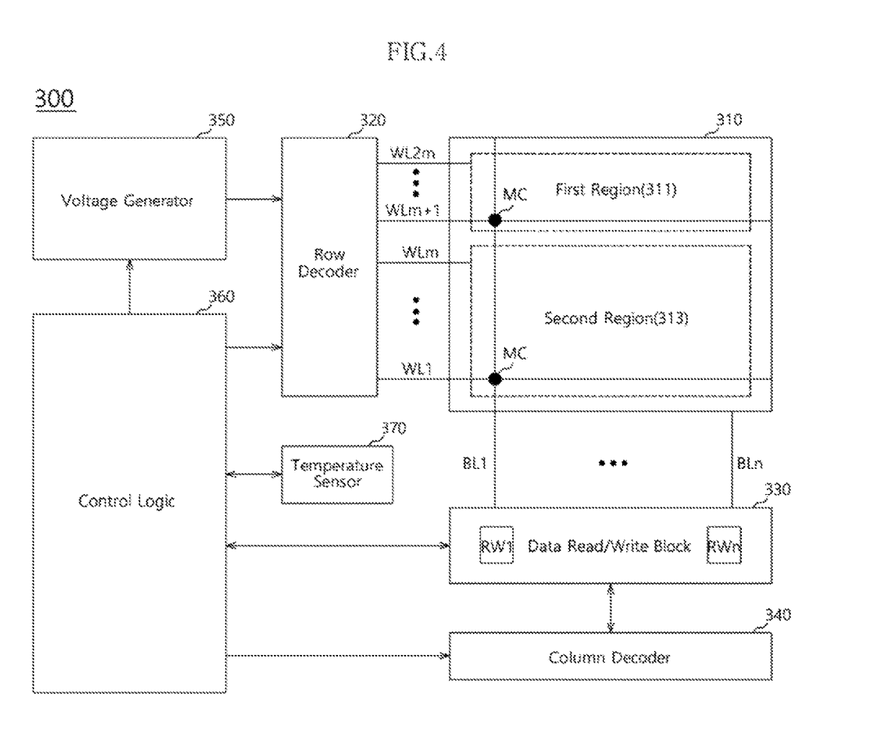
FIG. 4 is a block diagram illustrating an example configuration of the nonvolatile memory device shown in FIG. 1, according to an embodiment of the invention.

FIG. 4 is a block diagram illustrating an example configuration of the nonvolatile memory device 300, according to an embodiment of the present invention.

Referring to FIG. 4, the nonvolatile memory device 300 may include the memory cell region 310, a row decoder 320, a data read/write block 330, a column decoder 340, a voltage generator 350, the control logic 360, and the temperature sensor 370. In describing the nonvolatile memory device 300, although the term "write" may be used, it is to be noted that the term "write" has the same meaning as the term "program."

The memory cell region 310 may be divided into the first region 311 and the second region 313. The first region 311 may include memory cells MC which are arranged at areas where word lines WL2m to WLm+1 and bit lines BL1 to BLn intersect with each other. The second region 313 may include memory cells MC which are arranged at areas where word lines WLm to WL1 and the bit lines BL1 to BLn intersect with each other. The memory cells of each of the first region 311 and the second region 313 may be grouped by an access unit such as, for example, a memory block as an erase unit and a page as a program and read unit.

The first region 311 and the second region 313 may form a hybrid memory cell region comprising SLCs and MLCs, respectively.

The row decoder 320 may be coupled with the memory cell region 310 through the word lines WL1 to WL2m. The row decoder 320 may operate according to control of the control logic 360. The row decoder 320 may decode addresses provided from an external device (not shown). The row decoder 320 may select and drive the word lines WL1 to WL2m, based on decoding results. For instance, the row decoder 320 may provide a word line voltage provided from the voltage generator 350, to the word lines WL1 to WL2m.

The data read/write block 330 may be coupled with the memory cell region 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate, in a write operation, as a write driver for storing data provided from the external device, in the memory cell region 310. For another example, the data read/write block 330 may operate, in a read operation, as a sense amplifier for reading out data from the memory cell region 310.

The column decoder 340 may operate according to control of the control logic 360. The column decoder 340 may decode addresses provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell region 310. For example, a program voltage or a program verify voltage generated in a program operation may be applied to the word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, for example, based on control signals provided from an external device. For example, the control logic 360 may control operations of the nonvolatile memory device 300, such as at least one of a read, program and erase operations of the nonvolatile memory device 300.

In the case where the temperature compensation off command is provided, the control logic 360 may disable the temperature sensor 370, omit the temperature compensation operation and perform the following buffer program operation. The control logic 360 may control a program operation according to a temperature variation measured through the temperature sensor 370. For example, the control logic 360 may compare a measured temperature and the reference temperature, and may perform a program operation that compensates for a temperature variation, based on a comparison result. The program operation that compensates for a temperature variation (that is, the temperature compensation operation) will be described in detail with reference to FIG. 7.

Figure 5:
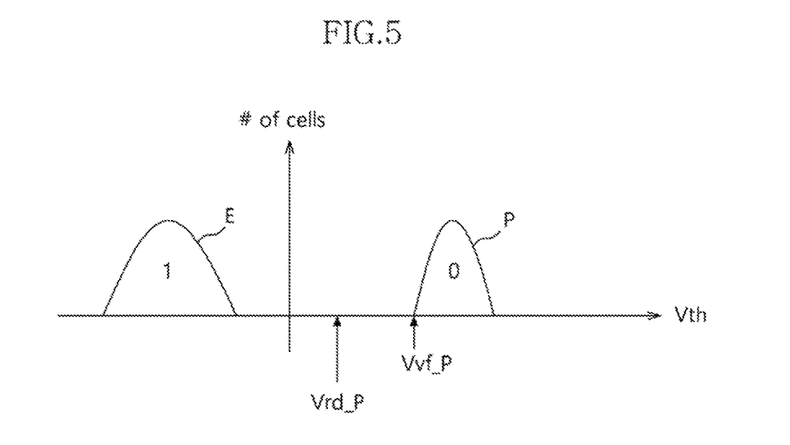
FIGS. 5 and 6 are diagrams illustrating examples of threshold voltage distributions of memory cells, according to an embodiment of the present invention.

FIG. 5 is a diagram illustrating threshold voltage distributions of memory cells according to an embodiment of the present invention. In an example, where the memory cells included in the first region 311 of FIG. 4 are SLCs, as shown in FIG. 5, the memory cells may be erased to have a threshold voltage of an erase state E, and may be programmed to have a threshold voltage of a program state P.

In a read operation, a read voltage Vrd_P having a voltage level between the erase state E and the program state P may be applied to the memory cells. If the read voltage Vrd_P is applied, a memory cell having a threshold voltage of the erase state E may be discriminated as an on cell which stores data "1," and a memory cell having a threshold voltage of the program state P may be discriminated as an off cell which stores data "0."

In a program operation, in order to determine whether memory cells are program-completed, a program verify voltage Vvf_P having a voltage level higher than the read voltage Vrd_P may be applied to memory cells. If the program verify voltage Vvf_P is applied, a memory cell having a threshold voltage lower than the program verify voltage Vvf_P may be discriminated as an on cell which stores data "1," that is, a memory cell which is not program-completed, and a memory cell having a threshold voltage higher than the program verify voltage Vvf_P may be discriminated as an off cell which stores data "0," that is, a memory cell which is program-completed.

Figure 6:
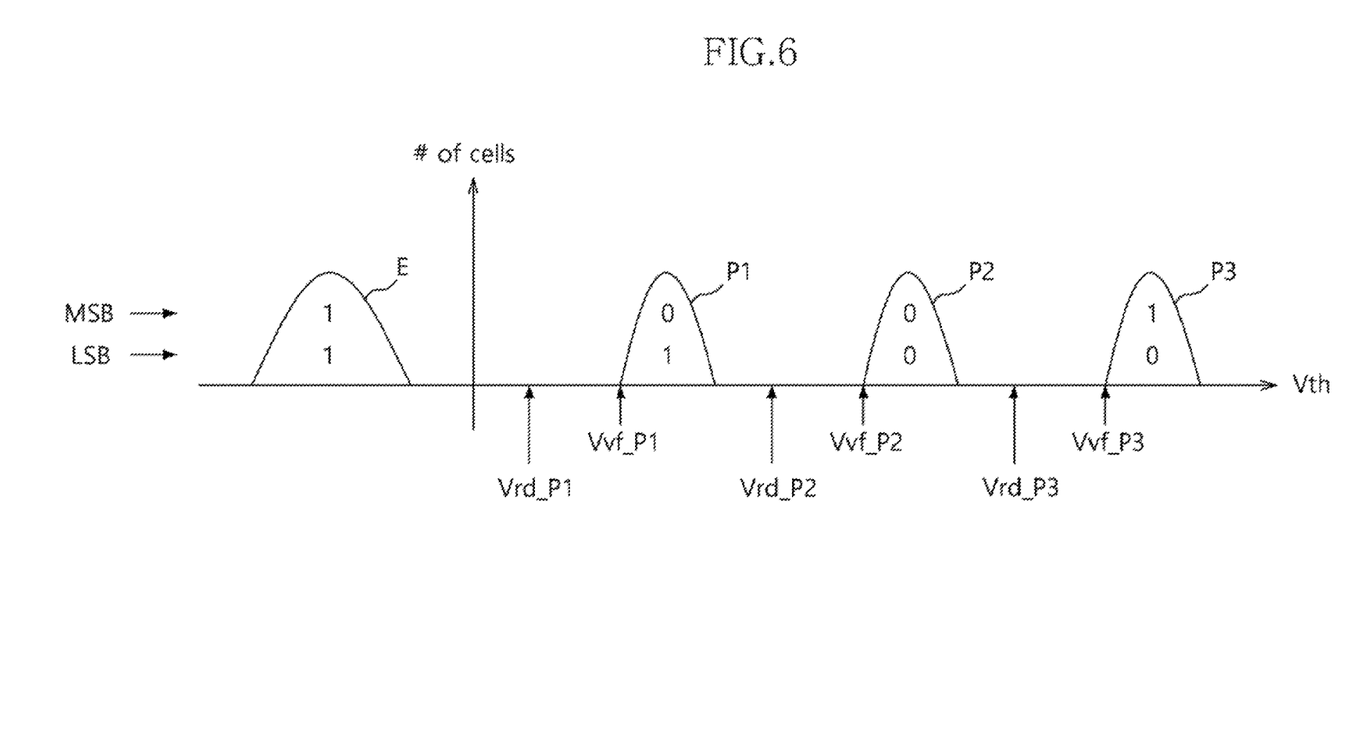

FIG. 6 is a diagram illustrating threshold voltage distributions of memory cells, according to an embodiment of the present invention. In an example, where the memory cells included in the second region 313 of FIG. 4 are 2-bit multi-level cells (MLC), as shown in FIG. 6, the memory cells may be erased to have a threshold voltage of an erase state E, and may be programmed to have a threshold voltage of any one among a plurality of program states P1, P2 and P3.

In a read operation, any one of a first read voltage Vrd_P1 having a voltage level between the erase state E and a first program state P1, a second read voltage Vrd_P2 having a voltage level between the first program state P1 and a second program state P2 and a third read voltage Vrd_P3 having a voltage level between the second program state P2 and a third program state P3 may be applied to memory cells.

If the second read voltage Vrd_P2 is applied, memory cells having threshold voltages of the erase state E and the first program state P1 may be discriminated as on cells which store LSB data "1," and memory cells having threshold voltages of the second program state P2 and the third program state P3 may be discriminated as off cells which store LSB data "0."

If the first read voltage Vrd_P1 is applied, memory cells having threshold voltages of the erase state E may be discriminated as on cells which store MSB data "1," and memory cells having threshold voltages of the first program state P1 may be discriminated as off cells which store MSB data "0."

If the third read voltage Vrd_P3 is applied, memory cells having threshold voltages of the second program state P2 may be discriminated as on cells which store MSB data "0," and memory cells having threshold voltages of the third program state P3 may be discriminated as off cells which store MSB data "1."

In a program operation, in order to determine whether memory cells are program-completed, program verify voltages Vvf_P1, Vvf_P2 and Vvf_P3 having voltage levels higher than the read voltages Vrd_P1, Vrd_P2 and Vrd_P3, respectively, may be applied to the memory cells.

If the program verify voltage Vvf_P1 is applied to memory cells which should be programmed to the first program state P1, a memory cell having a threshold voltage lower than the program verify voltage Vvf_P1 may be discriminated as an on cell which stores data "1," that is, a memory cell which is not program-completed, and a memory cell having a threshold voltage higher than the program verify voltage Vvf_P1 may be discriminated as an off cell which stores data "0," that is, a memory cell which is program-completed.

If the program verify voltage Vvf_P2 is applied to memory cells which should be programmed to the second program state P2, a memory cell having a threshold voltage lower than the program verify voltage Vvf_P2 may be discriminated as an on cell which stores data "1," that is, a memory cell which is not program-completed, and a memory cell having a threshold voltage higher than the program verify voltage Vvf_P2 may be discriminated as an off cell which stores data "0," that is, a memory cell which is program-completed.

If the program verify voltage Vvf_P3 is applied to memory cells which should be programmed to the third program state P3, a memory cell having a threshold voltage lower than the program verify voltage Vvf_P3 may be discriminated as an on cell which stores data "1," that is, a memory cell which is not program-completed, and a memory cell having a threshold voltage higher than the program verify voltage Vvf_P3 may be discriminated as an off cell which stores data "0," that is, a memory cell which is program-completed.

As described above with reference to FIGS. 5 and 6, a program verify operation for determining whether memory cells are program-completed may be performed during a program operation. The program verify operation may be performed by sensing current flowing according to a state of a memory cell (hereinafter, referred to as cell current). Cell current may vary according to a temperature. Therefore, as shown in FIG. 7, the control logic 360 may perform the program operation that compensates for a temperature variation (that is, the temperature compensation operation), to compensate for cell current variations.

Figure 7:
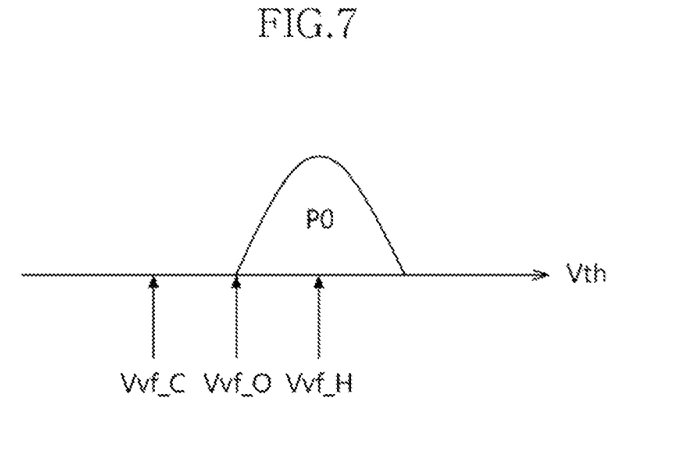
FIG. 7 is a diagram illustrating a temperature compensation operation of the nonvolatile memory device shown in FIG. 1, according to an embodiment of the present invention.

FIG. 7 is a diagram illustrating the temperature compensation operation of the nonvolatile memory device 300. As an example, FIG. 7 shows an optional program state P0. The optional program state P0 shown in FIG. 7 may represent any program state of the respective memory cells of the nonvolatile memory device 300.

If the temperature of the nonvolatile memory device 300 becomes lower than a normal temperature, the cell current flowing at the low temperature may be smaller than the cell current flowing at the normal temperature. The fact that the cell current decreases means that memory cells are highly likely to be discriminated as off cells, that is, program-completed memory cells. If a program verify voltage is lowered, because the cell current may be increased, a decreased cell current may be compensated for. Thus, if it is determined that a measured temperature is lower than a reference temperature, the control logic 360 may perform the temperature compensation operation by changing a program verify voltage to be applied in a program verify operation, to a cold program verify voltage Vvf_C having a voltage level lower than a normal program verify voltage Vvf_O, and applying the cold program verify voltage Vvf_C.

If the temperature of the nonvolatile memory device 300 becomes higher than the normal temperature, the cell current flowing at the high temperature may be larger than the cell current flowing at the normal temperature. The fact that the cell current increases means that memory cells are highly likely to be discriminated as on cells, that is, program-uncompleted memory cells. If a program verify voltage is raised, because the cell current is decreased, an increased cell current may be compensated for. Thus, if it is determined that a measured temperature is higher than the reference temperature, the control logic 360 may perform the temperature compensation operation by changing a program verify voltage to be applied in a program verify operation, to a hot program verify voltage Vvf_H having a voltage level higher than the normal program verify voltage Vvf_O, and applying the hot program verify voltage Vvf_H.

Figure 8:
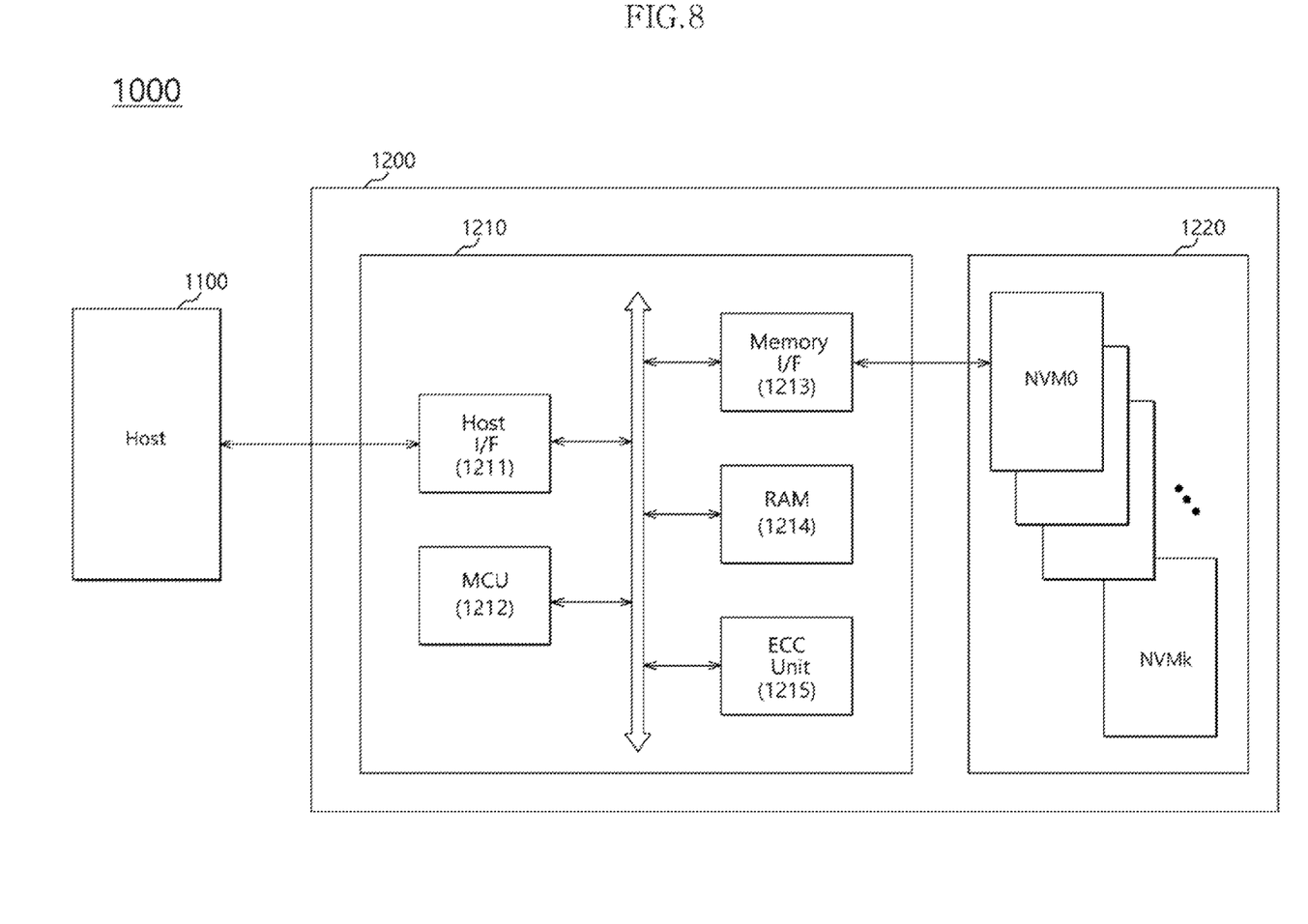
FIG. 8 is a block diagram illustrating a data processing system including a data storage device, according to an embodiment of the present invention

FIG. 8 is a block diagram illustrating a data processing system including a data storage device, according to an embodiment of the present invention. According to the embodiment of FIG. 8, a data processing system 1000 may include a host device 1100 and a data storage device 1200.

The data storage device 1200 may include a controller 1210 and a nonvolatile memory device 1220. The data storage device 1200 may be used by being coupled to the host device 1100 such as, for example, a mobile phone, an MP3 player, a laptop computer, a desktop computer, a game player, a TV, an in-vehicle infotainment system, and the like. The data storage device 1200 is also referred to as a memory system.

The controller 1210 may include a host interface unit 1211, a micro control unit 1212, a memory interface unit 1213, a random access memory 1214, and an error correction code (ECC) unit 1215.

The micro control unit 1212 may control general operations of the controller 1210 in response to a request from the host device 1100. The micro control unit 1212 may drive a firmware or a software for controlling the nonvolatile memory device 1220.

The random access memory 1214 may be used as the working memory of the micro control unit 1212. The random access memory 1214 may be used as a buffer memory which temporarily stores data read out from the nonvolatile memory device 1220 or data provided from the host device 1100.

The host interface unit 1211 may interface the host device 1100 and the controller 1210. For example, the host interface unit 1211 may communicate with the host device 1100 through one of various interface protocols, such as, for example, a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code (ECC) unit 1215 may ECC-encode data to be stored in the nonvolatile memory device 1220. Also, the error correction code (ECC) unit 1215 may ECC-decode data read out from the nonvolatile memory device 1220.

The nonvolatile memory device 1220 may be used as the storage medium of the data storage device 1200. The nonvolatile memory device 1220 may include a plurality of nonvolatile memory chips (or dies) NVM_1 to NVM_k.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and the like.

Figure 9:
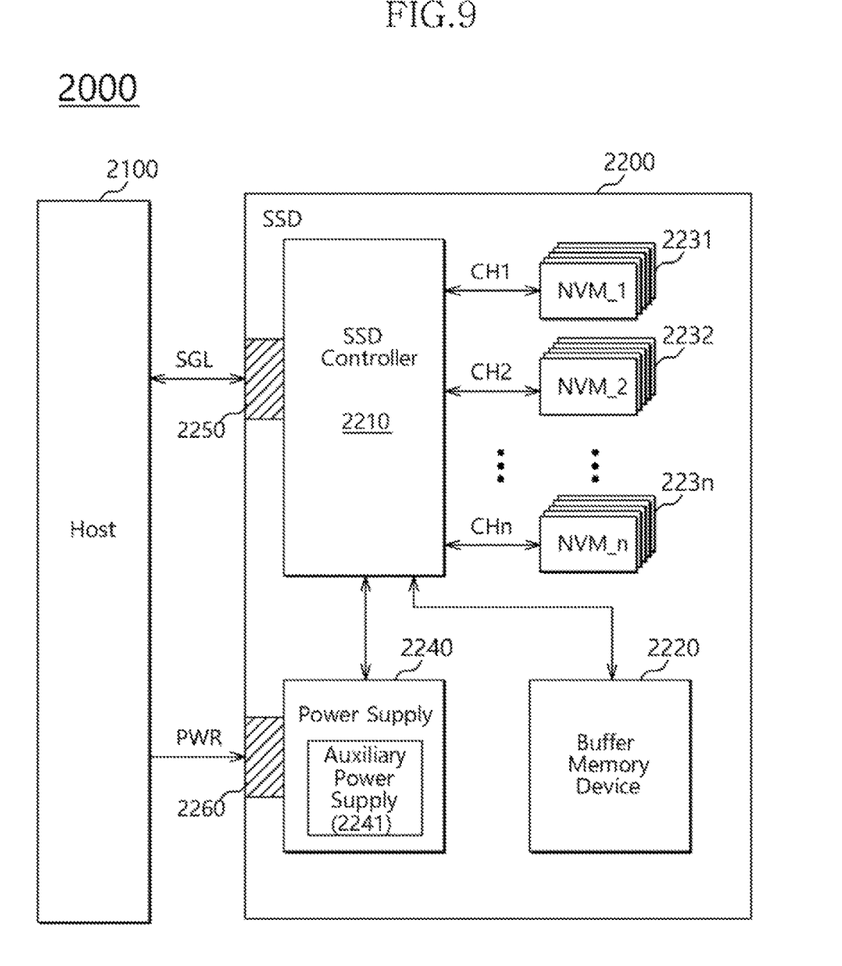
FIG. 9 is a block diagram illustrating a data processing system including a solid state drive (SSD), according to an embodiment of the present invention

FIG. 9 is a block diagram illustrating a data processing system including a solid state drive (SSD), according to an embodiment of the present invention. Referring to FIG. 9, a data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100.

The buffer memory device 2220 may temporarily store data which are to be stored in the nonvolatile memory devices 2231 to 223n. Further, the buffer memory device 2220 may temporarily store data which are read out from the nonvolatile memory devices 2231 to 223n. The data temporarily stored in the buffer memory device 2220 may be transmitted to the host device 2100 or the nonvolatile memory devices 2231 to 223n under control of the SSD controller 2210.

The nonvolatile memory devices 2231 to 223n may be used as storage media of the SSD 2200. The nonvolatile memory devices 2231 to 223n may be coupled with the SSD controller 2210 through a plurality of channels CH1 to CHn, respectively. One or more nonvolatile memory devices may be coupled to one channel. The nonvolatile memory devices coupled to one channel may be coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power so as to allow the SSD 2200 to be normally terminated when a sudden power-off occurs. The auxiliary power supply 2241 may include large capacitance capacitors capable of charging power PWR.

The SSD controller 2210 may exchange a signal SGL with the host device 2100 through the signal connector 2250. The signal SGL may include a command, an address, data, and the like. The signal connector 2250 may by or include a connector such as, for example, of parallel advanced technology attachment (PATA), serial advanced technology attachment (SATA), small computer system interface (SCSI), serial attached SCSI (SAS), peripheral component interconnection (PCI), PCI express (PCI-E) and a universal flash storage (UFS) protocols, according to an interface scheme between the host device 2100 and the SSD 2200.

Figure 10:
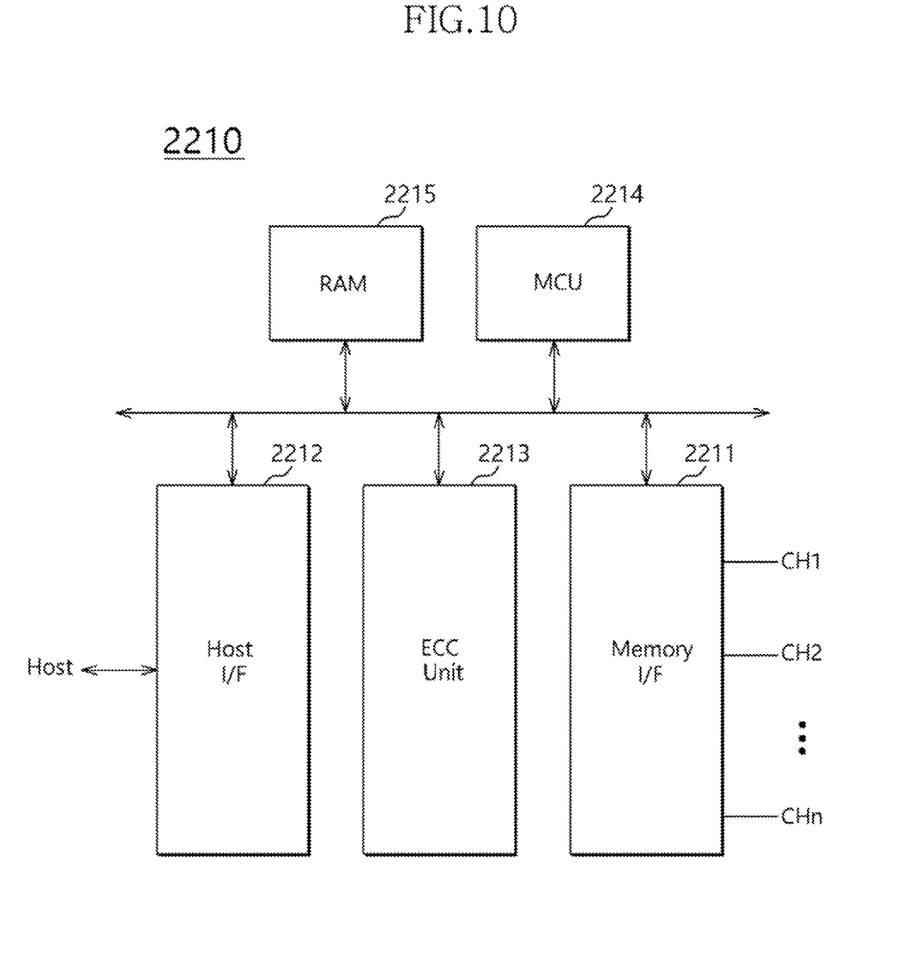
FIG. 10 is a block diagram illustrating an example configuration of the SSD controller shown in FIG. 9, according to an embodiment of the present invention.

FIG. 10 is a block diagram illustrating the SSD controller shown in FIG. 9. Referring to FIG. 10, the SSD controller 2210 may include a memory interface unit 2211, a host interface unit 2212, an error correction code (ECC) unit 2213, a control unit 2214, and a random access memory 2215.

The memory interface unit 2211 may provide control signals such as, for example, commands and addresses to the nonvolatile memory devices 2231 to 223n. Moreover, the memory interface unit 2211 may exchange data with the nonvolatile memory devices 2231 to 223n. The memory interface unit 2211 may scatter data transmitted from the buffer memory device 2220 to the respective channels CH1 to CHn, under control of the control unit 2214. Furthermore, the memory interface unit 2211 may transmit data read out from the nonvolatile memory devices 2231 to 223n to the buffer memory device 2220, under control of the control unit 2214.

The host interface unit 2212 may provide an interface with the SSD 2200 in correspondence to a protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI), PCI express (PCI-E) and a universal flash storage (UFS) protocols. In addition, the host interface unit 2212 may perform a disk emulating function of supporting the host device 2100 to recognize the SSD 2200 as a hard disk drive (HDD).

The control unit 2214 may analyze and process the signal SGL inputted from the host device 2100. The control unit 2214 may control operations of the buffer memory device 2220 and the nonvolatile memory devices 2231 to 223n according to a firmware or a software for driving the SSD 2200. The random access memory 2215 may be used as a working memory for driving the firmware or the software.

The error correction code (ECC) unit 2213 may generate parity data to be transmitted to the nonvolatile memory devices 2231 to 223n, among data stored in the buffer memory device 2220. The generated parity data may be stored, along with data, in the nonvolatile memory devices 2231 to 223n. The error correction code (ECC) unit 2213 may detect an error of the data read out from the nonvolatile memory devices 2231 to 223n. When the detected error is within a correctable range, the error correction code (ECC) unit 2213 may correct the detected error.

Figure 11:
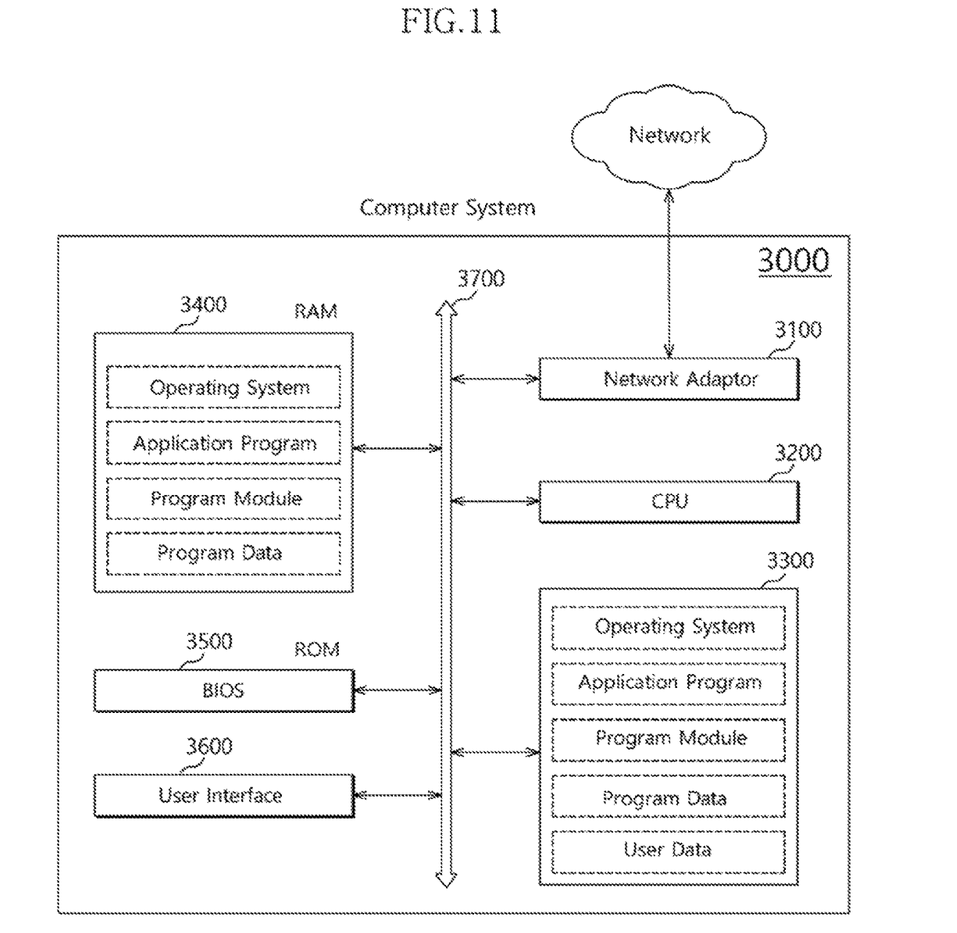
FIG. 11 is a block diagram illustrating a computer system to including a data storage device, according to an embodiment of the present invention.

FIG. 11 is a block diagram illustrating a computer system to which the data storage device according to the embodiment is mounted. Referring to FIG. 11, a computer system 3000 may include a network adaptor 3100, a central processing unit 3200, a data storage device 3300, a RAM 3400, a ROM 3500 and a user interface 3600, which are electrically coupled to a system bus 3700. The data storage device 3300 may be or include the data storage device 100 shown in FIG. 1, the data storage device 1200 shown in FIG. 8 or the SSD 2200 shown in FIG. 9.

The network adaptor 3100 may provide interfacing between the computer system 3000 and external networks. The central processing unit 3200 may perform general calculation processing for driving an operating system residing at the RAM 3400 or an application program.

The data storage device 3300 may store general data needed in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data needed for driving programs, which are read out from the data storage device 3300, may be loaded on the RAM 3400. A BIOS (basic input/output system) which is activated before the operating system is driven may be stored in the ROM 3500. Information exchange between the computer system 3000 and a user may be implemented through the user interface 3600.

While various embodiments have been described above, it will be understood to those skilled in the art that the embodiments described are examples only. Accordingly, the data storage device and the operating method thereof described herein should not be limited based on the described embodiments.

It is also noted, that in some instances, as would be apparent to those skilled in the relevant art, a feature or element described in connection with one embodiment may be used singly or in combination with other features or elements of another embodiment, unless otherwise specifically indicated.

Although various embodiments have been described for illustrative purposes, it will be apparent to those skilled in the relevant art that various changes and modifications may be made without departing from the spirit and scope of the invention as defined in the following claims.

What is claimed is:

1. A data storage device comprising:
   a nonvolatile memory device including a first region including a buffer region and a second region including a data region; and
   a controller suitable for controlling the nonvolatile memory device to perform a buffer program operation by storing write data in the first region in response to a program command from a host, report completion of the buffer program operation upon completion of the buffer program operation, and perform a main program operation by moving the write data from the first region to the second region,
   wherein the controller controls the nonvolatile memory device to perform a temperature compensation operation only for the second region.

2. The data storage device according to claim 1, wherein the controller controls the nonvolatile memory device to perform the buffer program operation without the temperature compensation operation.

3. The data storage device according to claim 1,
   wherein, during the main program operation, the controller provides a read command and an address of the first region to the nonvolatile memory device,
   wherein, during the main program operation, the nonvolatile memory device provides the controller with the write data read out from a memory cell corresponding to the address of the first region according to the read command,
   wherein, during the main program operation, the controller provides the nonvolatile memory device with the read-out write data, a program command for commanding program of the read-out write data and an address of the second region, and
   wherein, during the main program operation, the nonvolatile memory device programs the read-out write data in a memory cell corresponding to the address of the second region according to the program command for commanding program of the read-out data.

4. The data storage device according to claim 1, wherein the nonvolatile memory device comprises:
   a temperature sensor suitable for measuring an internal temperature; and
   a control logic suitable for controlling an operation for the memory cell region according to a command provided from the controller,
   wherein the control logic disables the temperature sensor during the buffer program operation.

5. The data storage device according to claim 4, wherein, when it is determined that a temperature measured through the temperature sensor is lower than a reference voltage, the control logic performs the temperature compensation operation by changing the program verify voltage to a cold program verify voltage having a voltage level lower than a normal program verify voltage and applying the cold program verify voltage.

6. The data storage device according to claim 4, wherein, when it is determined that a temperature measured through the temperature sensor is higher than the reference voltage, the control logic performs the temperature compensation operation by changing the program verify voltage to a hot program verify voltage having a voltage level higher than the normal program verify voltage and applying the hot program verify voltage.

7. The data storage device according to claim 1, wherein memory cell schemes between the first region and the second region are different from each other.

8. The data storage device according to claim 1, wherein storage capacity per memory cell of the first region is smaller than that of the second region.

9. The method according to claim 1, wherein the memory cells in the first region are SLCs and the memory cells in the second region are MLCs.

10. The method according to claim 1, wherein the memory cells in the first region are 2-bit cells and the memory cells in the second region are 3-bit cells.

11. A method for operating a data storage device including a first region including a buffer region and a second region including a data region, the method comprising:
- performing a buffer program operation by storing write data in the first region in response to a program command from a host;
- reporting completion of a program operation with the write data to the host upon completion of the buffer program operation; and
- performing a main program operation by moving the write data from the first region to the second region,
- wherein a temperature compensation operation is performed only to the second region.

12. The method according to claim 11, wherein the temperature compensation operation is omitted during the buffer program operation.

13. The method according to claim 11, the performing the main program operation comprises:
- reading out the write data from the first region; and
- programming the read-out write data in the second region.

14. The method according to claim 11, wherein performing the buffer program operation includes disabling a temperature sensor for the temperature compensation operation.

15. The method according to claim 11, wherein, when it is determined that a temperature measured through the temperature sensor is lower than a reference voltage, the temperature compensation operation is performed by changing the program verify voltage to a program verify voltage having a voltage level lower than a normal program verify voltage and applying the changed program verify voltage.

16. The method according to claim 11, wherein, when it is determined that a temperature measured through the temperature sensor is higher than the reference voltage, the temperature compensation operation is performed by changing the program verify voltage to a program verify voltage having a voltage level higher than the normal program verify voltage and applying the changed program verify voltage.

17. The method according to claim 11, wherein memory cell schemes between the first region and the second region are different from each other.

18. The method according to claim 11, wherein the storage capacity of the memory cells in the first region is smaller than the storage capacity of the memory cells in the second region.

19. The method according to claim 11, wherein the memory cells in the first region are SLCs and the memory cells in the second region are MLCs.

* * * * *